United States Patent
Adkisson et al.

(10) Patent No.: US 8,610,174 B2
(45) Date of Patent: Dec. 17, 2013

(54) BIPOLAR TRANSISTOR WITH A RAISED COLLECTOR PEDESTAL FOR REDUCED CAPACITANCE

(75) Inventors: James W. Adkisson, Jericho, VT (US); John J. Ellis-Monaghan, Grand Isle, VT (US); David L. Harame, Essex Junction, VT (US); Qizhi Liu, Lexington, MA (US); John J. Pekarik, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 13/307,412

(22) Filed: Nov. 30, 2011

(65) Prior Publication Data

US 2013/0134483 A1 May 30, 2013

(51) Int. Cl.
*H01L 31/109* (2006.01)
(52) U.S. Cl.
USPC ........... 257/197; 257/198; 257/565; 257/575; 257/E29.171
(58) Field of Classification Search
USPC .......... 257/197–198, 565, 557, 571, E21.608, 257/21.696, 29.174
See application file for complete search history.

(56) References Cited

U.S. PATENT DOCUMENTS

| | | | |
|---|---|---|---|
| 5,106,767 A | 4/1992 | Comfort et al. | |
| 5,567,961 A | 10/1996 | Usagawa et al. | |
| 5,766,999 A * | 6/1998 | Sato | 438/309 |
| 6,620,732 B1 | 9/2003 | Schuegraf | |
| 6,906,401 B2 | 6/2005 | Dunn et al. | |
| 6,940,149 B1 | 9/2005 | Divakaruni et al. | |
| 7,425,754 B2 * | 9/2008 | Akatsu et al. | 257/565 |
| 7,642,569 B2 * | 1/2010 | Greenberg et al. | 257/198 |
| 7,666,749 B2 | 2/2010 | Kim et al. | |
| 2008/0265282 A1 | 10/2008 | Gluschenkov et al. | |
| 2012/0001192 A1 * | 1/2012 | Fox et al. | 257/75 |

OTHER PUBLICATIONS

Chantre et al., "Pushing Conventional SiGe HBT Technology Towards "Dotfive" Terahertz," 2010 European Microwave Integrated Circuits Conference (EuMIC), Sep. 27-28, 2010, pp. 21-24.
Heinemann et al., "SiGe HBT Technology with fT/fmas of 300GHz/500GHz and 2.0 ps CML Gate Delay," 2010 IEEE International Electron Devices Meeting (IEDM), 2010, pp. 30.5.1-30.5.4.
Huylenbroeck et al., "A 400GHz fMAX Fully Self-Aligned SiGe: C HBT Architecture," BCTM, 2009, pp. 5-8.

(Continued)

*Primary Examiner* — Dung A. Le
(74) *Attorney, Agent, or Firm* — Gibb & Riley, LLC; Michael J. LeStrange, Esq.

(57) ABSTRACT

Disclosed is a transistor with a raised collector pedestal in reduced dimension for reduced base-collector junction capacitance. The raised collector pedestal is on the top surface of a substrate, extends vertically through dielectric layer(s), is un-doped or low-doped, is aligned above a sub-collector region contained within the substrate and is narrower than that sub-collector region. An intrinsic base layer is above the raised collector pedestal and the dielectric layer(s). An extrinsic base layer is above the intrinsic base layer. Thus, the space between the extrinsic base layer and the sub-collector region is increased. This increased space is filled by dielectric material and the electrical connection between the intrinsic base layer and the sub-collector region is provided by the relatively narrow, un-doped or low-doped, raised collector pedestal. Consequently, base-collector junction capacitance is reduced and, consequently, the maximum oscillation frequency is increased.

22 Claims, 4 Drawing Sheets

(56) References Cited

OTHER PUBLICATIONS

Donkers et al., "A Novel Fully Self-Aligned SiGe: C HBT Architecture Featuring a Single-Step Epitaxial Collector-Base Process," IEDM, 2007, pp. 655-658.

Armin Tilke et al., "A Low-Cost Fully Self-Aligned SiGe BiCMOS Technology Using Selective Epitaxy and a Lateral Quasi-Single-Poly Integration Concept", IEEE Transactions on Electron Devices, vol. 51, No. 7, Jul. 2004.

\* cited by examiner

BIPOLAR TRANSISTOR WITH A RAISED COLLECTOR PEDESTAL FOR REDUCED CAPACITANCE

BACKGROUND

1. Field of the Invention

The embodiments disclosed herein relate to transistors and, more particularly, to a transistor structure (e.g., a bipolar junction transistor (BJT) structure or a heterojunction bipolar transistor (HBT) structure) with a raised collector pedestal for reduced base-collector junction capacitance $C_{bc}$ and to a method of forming the transistor structure.

2. Description of the Related Art

For transistors used in radio frequency (RF) applications (e.g., bipolar junction transistors (BJTs) and, particularly, high performance heterojunction bipolar transistors (HBTs)), it is desirable to have a relatively high transit frequency $f_T$ and a relatively high maximum oscillation frequency $F_{max}$. $F_{max}$ is a function of $f_T$ and also of various parasitics, including parasitic resistances and parasitic capacitances. One such parasitic capacitance is base-collector junction capacitance $C_{bc}$. Reduction of this base-collector junction capacitance $C_{bc}$ can result in a higher $F_{max}$. Thus, it would be advantageous to provide a transistor structure, such as a bipolar junction transistor (BJT) or heterojunction bipolar transistor (HBT) structure, with reduced base-collector junction capacitance $C_{bc}$ as well as a method for forming such a transistor structure.

SUMMARY

In view of the foregoing, disclosed herein are embodiments of a transistor structure (e.g., bipolar junction transistor (BJT) structure or a heterojunction bipolar transistor (HBT) structure) and a method of forming the transistor structure with an un-doped or low-doped raised collector pedestal with reduced dimensions for reduced base-collector junction capacitance $C_{bc}$. Specifically, in the embodiments, an un-doped or low-doped raised collector pedestal can be positioned on the top surface of a semiconductor substrate, can extend vertically through at least one dielectric layer, can be aligned above a sub-collector region contained within the substrate and can be narrower than that sub-collector region. An intrinsic base layer can be positioned above the raised collector pedestal and the dielectric layer(s). An extrinsic base layer can be positioned above the intrinsic base layer. In such a transistor structure, the space between the extrinsic base layer and the sub-collector region within the semiconductor substrate is increased as compared to prior art transistor structures. This increased space is filled by dielectric material and the electrical connection (i.e., the link-up or reach-through) between the intrinsic base layer and the sub-collector region is provided by the relatively narrow, un-doped or low-doped, raised collector pedestal. As a result, base-collector junction capacitance $C_{bc}$ is reduced and, consequently, the maximum oscillation frequency $F_{max}$ is increased.

More particularly, disclosed herein are embodiments of a transistor structure (e.g., a bipolar junction transistor (BJT) structure or a heterojunction bipolar transistor (HBT) structure). The transistor structure can comprise a semiconductor substrate (e.g., a silicon substrate) and a sub-collector region within the semiconductor substrate. Dielectric layer(s) can be positioned on the top surface of the semiconductor substrate above the sub-collector region. A trench can extend vertically through the dielectric layer(s) to the semiconductor substrate, can be aligned above the sub-collector region and can be narrower than the sub-collector region. The trench can be filled with a semiconductor layer. For example, in the case of either a bipolar junction transistor (BJT) or a heterojunction bipolar transistor (HBT), this semiconductor layer that fills the trench can comprise a selectively grown epitaxial semiconductor layer, such as a selectively grown epitaxial silicon layer. Additionally, this semiconductor layer can be un-doped or, alternatively, can be low-doped so as to have the same conductivity type as the sub-collector region. Thus, this semiconductor layer comprises an un-doped or low-doped raised collector pedestal. An intrinsic base layer (e.g., a non-selectively grown epitaxial semiconductor layer, such as a non-selectively grown epitaxial silicon layer in the case of a BJT or a non-selectively grown epitaxial silicon germanium layer in the case of an HBT) can be positioned above the dielectric layer(s) and the semiconductor layer (i.e., above the raised collector pedestal). Finally, the transistor structure can further comprise additional features above the intrinsic base layer. These additional features can include, but are not limited to, a raised extrinsic base layer, an emitter layer, dielectric spacer(s), additional dielectric layers and contacts.

Also disclosed herein are embodiments of a method of forming a transistor structure (e.g., a bipolar junction transistor (BJT) structure or a heterojunction bipolar transistor (HBT) structure). The method embodiments can comprise providing a semiconductor substrate (e.g., a silicon substrate) and forming a sub-collector region within the substrate. Dielectric layer(s) can be formed on the semiconductor substrate above the sub-collector region. Next, a trench can be formed such that it extends vertically through the dielectric layer(s) to the substrate, such that it is aligned above the sub-collector region and such that it is narrower than the sub-collector region. After the trench is formed, it can be filled with a semiconductor layer. For example, in the case of either a bipolar junction transistor (BJT) or a heterojunction bipolar transistor (HBT), an epitaxial semiconductor layer (e.g., an epitaxial silicon layer) can be selectively grown on the surface of the semiconductor substrate exposed within the trench. This semiconductor layer can be left un-doped or can be low-doped (e.g., in situ doped or subsequently implanted) such that it has the same conductivity type as the sub-collector region. Thus, the resulting semiconductor layer comprises an un-doped or low-doped raised collector pedestal. An intrinsic base layer can then be formed above the dielectric layer(s) and the semiconductor layer (i.e., above the raised collector pedestal). For example, an epitaxial semiconductor layer (e.g., an epitaxial silicon layer in the case of a BJT or an epitaxial silicon germanium layer in the case of an HBT) can be non-selectively grown on the dielectric layer(s) and the semiconductor layer. Finally, additional process steps can be performed to complete the transistor structure. These additional process steps can include, but are not limited to, formation of the following features above the intrinsic base layer: an extrinsic base layer, an emitter layer, dielectric spacer(s), additional dielectric layers, and contacts.

BRIEF DESCRIPTION OF THE DRAWINGS

The embodiments herein will be better understood from the following detailed description with reference to the drawings, which are not necessarily drawing to scale and in which.

DETAILED DESCRIPTION

As mentioned above, for transistors used in radio frequency (RF) applications (e.g., bipolar junction transistors (BJTs) and, particularly, high performance heterojunction bipolar transistors (HBTs)), it is desirable to have a relatively high transit frequency $f_T$ and a relatively high maximum oscillation frequency $F_{max}$. $F_{max}$ is a function of $f_T$ and also of various parasitics, including parasitic resistances and parasitic capacitances. One such parasitic capacitance is base-collector junction capacitance $C_{bc}$. Reduction of this base-collector junction capacitance $C_{bc}$ can result in a higher $F_{max}$.

A conventional bipolar junction transistor (BJT) structure or heterojunction bipolar transistor (HBT) structure typically comprises a collector region within a semiconductor substrate and an intrinsic base layer, an extrinsic base layer and an emitter layer above the semiconductor substrate. Specifically, the intrinsic base layer can be on the surface of the semiconductor substrate above the collector region. The extrinsic base layer can be on the intrinsic base layer and the emitter layer can comprise an essentially T-shaped emitter layer that has a lower portion, which extends vertically through the extrinsic base layer to the intrinsic base layer. This emitter layer can be electrically isolated from the extrinsic base layer and can be aligned above the collector region. In such a transistor structure, the base-collector junction capacitance $C_{bc}$ can be relatively high due to the size, conductivity level and location of the collector region within the semiconductor substrate relative to the extrinsic base layer above.

In view of the foregoing, disclosed herein are embodiments of a transistor structure (e.g., bipolar junction transistor (BJT) structure or a heterojunction bipolar transistor (HBT) structure) and a method of forming the transistor structure with an un-doped or low-doped raised collector pedestal with reduced dimensions for reduced base-collector junction capacitance $C_{bc}$. Specifically, in the embodiments, an un-doped or low-doped raised collector pedestal can be positioned on the top surface of a semiconductor substrate, can extend vertically through at least one dielectric layer, can be aligned above a sub-collector region contained within the substrate and can be narrower than that sub-collector region. An intrinsic base layer can be positioned above the raised collector pedestal and the dielectric layer(s). An extrinsic base layer can be positioned above the intrinsic base layer. An essentially T-shaped emitter layer can have a lower portion that extends vertically through the extrinsic base layer to the intrinsic base layer, that is electrically isolated from the extrinsic base layer and that is aligned above the raised collector pedestal. Thus, the space between the extrinsic base layer and the sub-collector region within the semiconductor substrate is increased as compared to prior art transistor structures. This increased space is filled by dielectric material and the electrical connection (i.e., the link-up or reach-through) between the intrinsic base layer and the sub-collector region is provided by the relatively narrow, un-doped or low-doped, raised collector pedestal. As a result, base-collector junction capacitance $C_{bc}$ is reduced and, consequently, the maximum oscillation frequency $F_{max}$ is increased.

Figure 1:
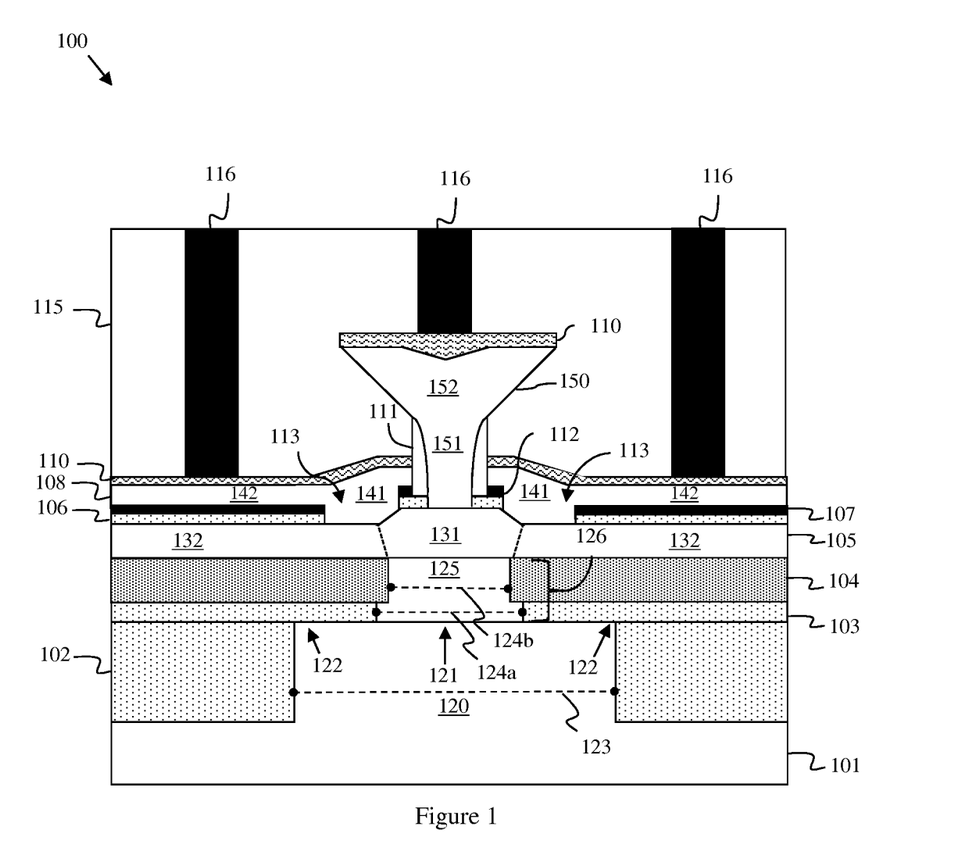
FIG. 1 is a cross-section diagram illustrating embodiments of a bipolar junction transistor (BJT) or heterojunction bipolar transistor (HBT)

More particularly, referring to FIG. 1, disclosed herein are embodiments of a transistor structure 100. This transistor structure 100 can comprise, for example, a bipolar junction transistor (BJT) structure. Alternatively, this transistor structure 100 can comprise a heterojunction bipolar transistor (HBT) structure.

In any case, this transistor structure 100 can comprise a semiconductor substrate 101. This semiconductor substrate 101 can comprise a monocrystalline semiconductor material. For example, the semiconductor substrate 101 can comprise a bulk silicon substrate or any other suitable bulk semiconductor substrate, as illustrated in FIG. 1. Alternatively, the semiconductor substrate 101 can comprise a semiconductor layer of a semiconductor-on-insulator (SOI) wafer (e.g., a silicon layer of a silicon-on-insulator (SOI) wafer) (not shown). The semiconductor substrate 101 can have a first type conductivity (e.g., a P-type conductivity). Thus, for example, the semiconductor substrate 101 can comprise a P− silicon substrate (i.e., a silicon substrate having a relatively low concentration of a P-type dopant).

The transistor structure 100 can further comprise a sub-collector region 120 within the semiconductor substrate 101. This sub-collector region 120 can have a second type conductivity that is different from the first type conductivity (e.g., an N-type conductivity). This sub-collector region 120 can comprise a single N-well region. Alternatively, the sub-collector region 120 can comprise multiple N-type collector components, having different doping concentrations and, thereby different conductivity levels. For example, the sub-collector region 120 can comprise the following collector components described and illustrated in U.S. Patent Publication No. 2008/0265282 of Gluschenkov et al., published on Oct. 30, 2008, assigned to International Business Machines Corporation, and incorporated herein by reference: a N+ buried collector within the semiconductor substrate; a N-collector above the N+ buried collector and extending to the top surface of the semiconductor substrate; and an N+ selective implant collector (SIC) within the N-collector immediately adjacent to the N+ buried collector and separated from the top surface of the substrate by some distance. It should be noted that this region 120 is referred to as a sub-collector region because it is positioned below the raised collector pedestal, discussed in greater detail below.

The transistor structure 100 can further comprise a shallow trench isolation (STI) region 102 within and at the top surface of the semiconductor substrate 101. This STI region 102 can be positioned laterally immediately adjacent to the outer edges 122 of the sub-collector region 120. Specifically, the STI region 102 can define the active area of the transistor structure 100 and, particularly, can define the dimensions (e.g., the length (not shown) and the width 123) of the sub-collector region 120. This STI region 102 can comprise, for example, a conventional STI structure comprising a relatively shallow trench filled with one or more isolation materials (e.g., silicon dioxide ($SiO_2$), silicon nitride (SiN), silicon oxynitride (SiON) or any other suitable isolation material or combination thereof).

The transistor structure 100 can further comprise at least one dielectric layer 103, 104 on the top surface of the semiconductor substrate 101 above the sub-collector region 120 and the STI region 102. The dielectric layer(s) can have a total thickness ranging from 10-400 nm and, preferably, ranging from 60-120 nm (e.g., 90 nm) as measured from the top surface of the semiconductor substrate 101 to the top surface of the dielectric layer(s). In one embodiment, the transistor structure 100 comprises a first dielectric layer 103 and a second dielectric layer 104 stack above the first dielectric layer 103. The first and second dielectric layers 103, 104 can comprise different dielectric materials. For example, the first dielectric layer 103 can comprise a silicon dioxide ($SiO_2$) layer 103 that blankets the top surface of the semiconductor substrate 101 over the sub-collector region 120 and the STI region 102. This first dielectric layer 103 can have a thickness ranging from 10 nm to 30 nm (e.g., a thickness of approximately 20 nm). The second dielectric layer 104 can comprise, for example, a silicon nitride (SiN) layer 104 stacked on top of the first dielectric layer 103. This second dielectric layer 104 can have a thickness ranging from 50 nm to 90 nm (e.g., a thickness of approximately 70 nm). Alternatively, the dielectric layer(s) can comprise any one or more of the following: a silicon oxynitride (SiNO) layer, a high-K dielectric layer (e.g., hafnium oxide ($HFO_2$), zirconium oxide (ZrO2), etc.), or any other suitable dielectric layer(s).

A trench 126 (i.e., an opening that is, for example, lithographically patterned and etched) can extend vertically through the dielectric layer(s) 104, 103 to the semiconductor substrate 101. This trench 126 can be aligned above sub-collector region 120. That is, this trench 126 can be essentially centered within the STI region 102 such that it is above the center portion 121 of the sub-collector region 120. Furthermore, this trench 126 can be narrower than the sub-collector region 120, as defined by the STI region 102, such that the edge portions 122 of the collector region remain covered by the dielectric layer(s) 103-104.

It should be noted that, as a function of the process steps used to form and subsequently fill the trench 126 (see detailed discussion with regard to the method embodiments), the lower portion of the trench 126 within the first dielectric layer 103 (e.g., within the silicon dioxide ($SiO_2$) layer) may have a first width 124$a$ and the upper portion of the trench 126 within the second dielectric layer 104 (e.g., within the silicon nitride (SiN) layer) may have a second width 124$b$ that is slightly less (e.g., a few nanometers to tens of nanometers less) than the first width 124$a$. However, the maximum width of the trench 126 should still be less than the width 123 of the sub-collector region 120 below, as defined by the STI regions 102. That is, in any case the sidewalls of the trench 126 should be aligned above the sub-collector region 120 and not the STI region 102. Additionally, the depth of the trench 126 should be approximately equal to the total thickness of the dielectric layer(s) 103-104 such that the surface of the sub-collector region 120 is exposed. In one embodiment, the width 124$b$ of the upper portion of the trench 126 within the second dielectric layer 104 can range from ⅓ to 9/10 the width 123 of the sub-collector region 120 (e.g., the width 124$a$ can be approximately ½ the width 123 of the sub-collector region 120) and the width 124$a$ of the lower portion of the trench 126 within the first dielectric layer 124$a$ can be 5-50 nanometers greater than the width 124$b$.

The trench 126 can be filled with a semiconductor layer 125. For example, in the case of either a bipolar junction transistor (BJT) or a heterojunction bipolar transistor (HBT), the semiconductor layer 125 that fills the trench 126 can comprise a selectively grown epitaxial semiconductor layer (e.g., a selectively grown epitaxial silicon layer). Those skilled in the art will recognize that under certain process conditions a semiconductor layer can be selectively grown such that it is deposited on the exposed surface a semiconductor substrate (e.g., a silicon substrate 101) and not on adjacent dielectric material (e.g., a silicon dioxide ($SiO_2$) layer 103 or a silicon nitride (SiN) layer 104). Those skilled in the art will further recognize as a result of such a selective epitaxy process the semiconductor layer 125 that fills the trench will typically have the same crystalline structure as the semiconductor substrate on which it is grown (e.g., a monocrystalline structure). Additionally, it should be noted that this semiconductor layer 125 can be un-doped. Alternatively, this semiconductor layer 125 can be doped with a relatively low concentration of a second type conductivity dopant (e.g., an N-type dopant) such that it has the same type conductivity as the sub-collector region 120, but a lower conductivity level. For example, the semiconductor layer 125 can comprise an N− semiconductor layer. Thus, the semiconductor layer 125 that fills the trench 126 can comprise an un-doped or low-doped raised collector pedestal aligned above and in contact with the sub-collector region 120 within the semiconductor substrate 101 below.

The transistor structure 100 can further comprise an intrinsic base layer 105 above and immediately adjacent to the top surface of the dielectric layer(s) and the top surface of the semiconductor layer 125 within the trench 126 (i.e., above and immediately adjacent to the raised collector pedestal). This intrinsic base layer 105 can comprise another semiconductor layer. For example, in the case of a BJT, the intrinsic base layer 105 can comprise a silicon layer. Alternatively, in the case of an HBT, the intrinsic base layer 105 can comprise a silicon germanium layer. In any case, this intrinsic base layer 105 can, for example, comprise a non-selectively grown epitaxial semiconductor layer having a first section 131 (e.g., an inner section) and a second section 132 (e.g., an outer section) positioned laterally adjacent to the inner section 131. The first section 131 can be positioned above and immediately adjacent to the semiconductor layer 125 within the trench 126 (i.e., immediately adjacent to the raised collector pedestal). The second section 132 can be immediately adjacent to the top surface of the dielectric layer(s) and, thus, above the edge portion 122 of the sub-collector region 120 and also above the STI region 102. Those skilled in the art will recognize that, when a non-selective epitaxy process is used to form the intrinsic base layer 105, the first section 131, which is formed immediately adjacent to the monocrystalline semiconductor layer 125, will typically comprise a monocrystalline semiconductor material, and the second section 132, which is formed immediately adjacent to the second dielectric layer 104 (e.g., the silicon nitride (SiN) layer), will typically comprise a polycrystalline semiconductor material and will be less thick than the first section 131. Finally, the intrinsic base layer 105 can be un-doped or, alternatively, it can be doped with a relatively low concentration of a first type conductivity dopant (e.g., a P-type dopant) such that it has the same type conductivity as the substrate 101 (e.g., P-type conductivity).

As with conventional bipolar junction transistor (BJT) structures and conventional heterojunction bipolar transistor (HBT) structures, the transistor structure 100 disclosed herein can further comprise additional features including, but not limited to, additional dielectric layer(s), a mask layer, dielectric spacer(s), a raised extrinsic base layer, silicide layer(s), an emitter layer, contacts, etc. Various different configurations for these additional features are well known in the art and can be incorporated into different embodiments of the transistor structure 100. For example, as shown in FIG. 1, in one exemplary embodiment, the transistor structure 100 can further comprise a third dielectric layer 106, a mask layer 107, a raised extrinsic base layer 108, dielectric spacers (111), an emitter layer 150, silicide layers 110, additional dielectric layer(s) 115, contacts 116, etc.

Specifically, the third dielectric layer 106 can be positioned above and immediately adjacent to the intrinsic base layer 105. This third dielectric layer 106 can comprise the same dielectric material or a different dielectric material than that used for the first dielectric layer 103 or the second dielectric layer 104. Thus, this third dielectric layer 106 can comprise, for example, a silicon dioxide ($SiO_2$) layer, a silicon nitride (SiN) layer, a silicon oxynitride (SiNO), a high-K dielectric layer (e.g., hafnium oxide ($HFO_2$), zirconium oxide (ZrO2), etc.), or any other suitable dielectric layer capable of blocking dopant diffusion. A mask layer 107 (e.g., a polysilicon mask layer or other suitable mask layer) can be above the third dielectric layer. An opening 113 can extend vertically through the mask layer 107 and the third dielectric layer 106 to the intrinsic base layer 105. This opening 113 can be aligned above the interface between the first and second sections 131-132 of the intrinsic base layer 105 so as to leave an emitter opening landing pad portion 112 essentially centered above the first section 131 of the intrinsic base layer 105 and so as to further leave a remaining portion above the second section 132 of the intrinsic base layer 105.

The raised extrinsic base layer 108 can be positioned above the mask layer 107 and can fill the opening 113. Specifically, the raised extrinsic base layer 108 can comprise a first portion 141 within the opening 113 such that it is above and immediately adjacent to the intrinsic base layer 105, thereby creating an extrinsic base to intrinsic base link-up region. The raised extrinsic base layer 108 can further comprise a second portion 142 that extends laterally over the mask layer 107 above the second section 132 of the intrinsic base layer 105. This raised extrinsic base 108 can comprise yet another semiconductor layer (e.g., a non-selectively grown epitaxial semiconductor layer, such as a non-selectively grown epitaxial silicon layer, in the case of either a BJT or an HBT). This raised extrinsic base layer 108 can further have the first type conductivity (e.g., P-type conductivity). The concentration of first type conductivity dopant (e.g., P-type dopant) in the raised extrinsic base layer 108 can be relatively high as compared to the concentration of the same type conductivity dopant in the intrinsic base layer 105, if applicable, or the semiconductor substrate 101.

An emitter layer 150 (e.g., an essentially T-shaped emitter layer) can be positioned above the first section 131 of the intrinsic base layer 105. Specifically, the emitter layer 150 can have a lower portion that extends vertically through the raised extrinsic base layer 108 and the emitter opening landing pad 112 to the first section 131 of the intrinsic base layer 105. At least one dielectric spacer 111 can positioned in the emitter opening and can surround the lower portion of the emitter layer 150 so as to electrically isolate it from the raised extrinsic base layer 108. The dielectric spacer(s) 111 can comprise a dielectric material, such as silicon nitride (SiN), silicon oxynitride (SiON) or any other suitable dielectric material. The emitter layer 150 can further have an upper portion 152, which is above and wider than the lower portion 151 such that it extends laterally over at least the dielectric spacer(s) 111. The emitter layer 150 can comprise, for example, a polycrystalline semiconductor layer (e.g., a polycrystalline silicon layer) having the same second type conductivity as the sub-collector region 120 (e.g., N-type conductivity).

A metal silicide layer 110 can be positioned on the top surface of the raised extrinsic base layer 108 and, particularly, over the second portion 142 of the raised extrinsic base layer 108. Optionally, this metal silicide layer 110 can further extend laterally over the first portion 141 of the raised extrinsic base layer. Additionally, a metal silicide layer 110 can be positioned on the top surface of the upper portion of the emitter layer 150. Such metal silicide layers 110 can comprise silicides of, for example, a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. It should be noted that, if applicable, the dielectric spacer 111 can also isolate the lower portion of the emitter layer 150 from any metal silicide layer 110 on the raised extrinsic base layer 108.

One or more additional dielectric layer(s) 115 can blanket (i.e., cover) the transistor structure 100, as described above. These additional dielectric layer(s) can comprise, for example, any suitable interlayer dielectric material(s). For example, the additional dielectric layer(s) 115 can comprise any of silicon dioxide ($SiO_2$), silicon nitride (SiN), borophosphosilicate glass (BPSG), etc. Finally, contacts 116 can extend vertically through the dielectric layer(s) 115 in order to contact the raised extrinsic base layer 108, the emitter layer 150, etc.

Consequently, in the embodiments of the transistor structure 100 described above, the space between the extrinsic base layer 108 and the sub-collector region 120 within the semiconductor substrate 101 is increased as compared to prior art transistor structures and this increased space is filled by dielectric material (e.g., dielectric layers 103-104). Furthermore, the electrical connection (i.e., the link-up or reach-through) between the intrinsic base layer 105 and the sub-collector region 120 within the semiconductor substrate 101 is provided by the relatively narrow, un-doped or low-doped, raised collector pedestal 125. As a result, base-collector junction capacitance $C_{bc}$ is reduced within this transistor structure 100 and, consequently, the maximum oscillation frequency $F_{max}$ is increased.

Figure 2:
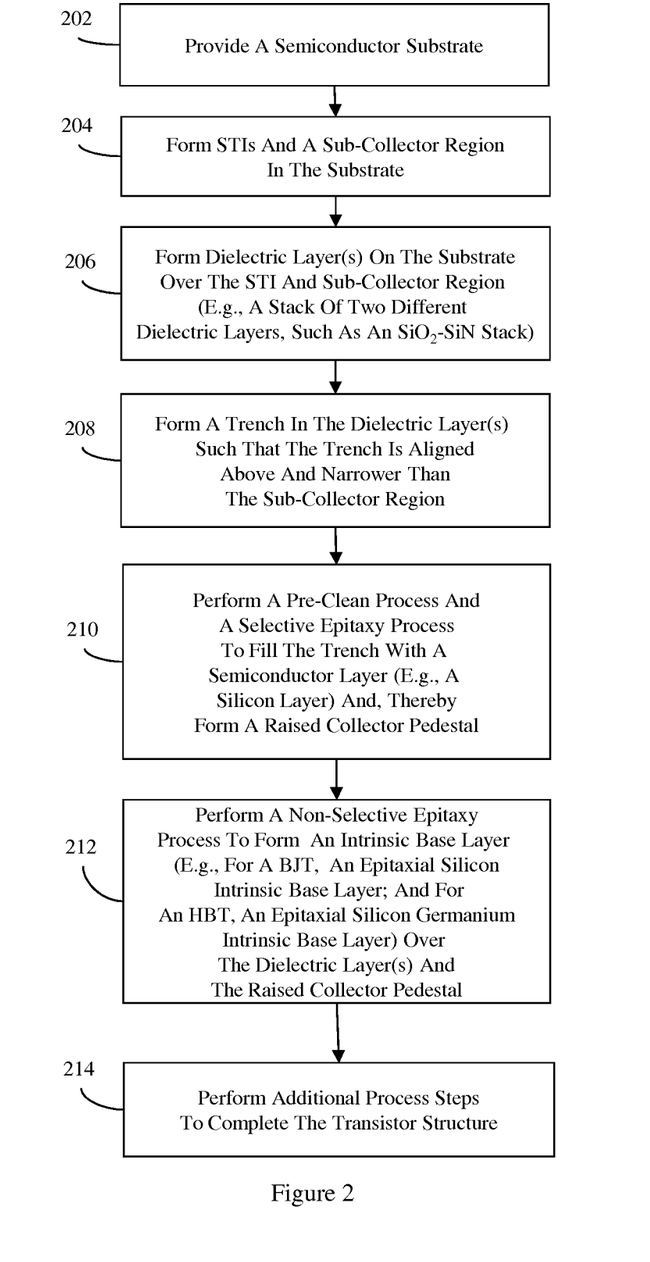
FIG. 2 is a flow diagram illustrating embodiments of a method of forming the BJT or HBT of FIG. 1.

Referring to FIG. 2, also disclosed herein are embodiments of a method of forming a transistor structure 100 (e.g., bipolar junction transistor (BJT) structure or a heterojunction bipolar transistor (HBT) structure), such as that described in detail above and illustrated in FIG. 1.

Figure 3:
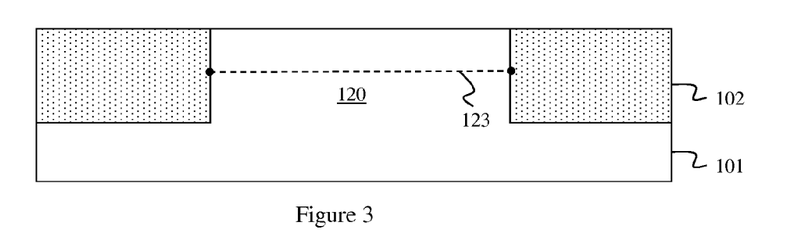
FIG. 3 is a cross-section diagram illustrating a partially completed BJT or HBT formed according to the method of FIG. 2.

The method embodiments can comprise providing a semiconductor substrate 101 (202). This semiconductor substrate 101 can comprise a monocrystalline semiconductor material. For example, the semiconductor substrate 101 can comprise a bulk silicon substrate or any other suitable bulk semiconductor substrate, as illustrated in FIG. 3. Alternatively, the semiconductor substrate 101 can comprise a semiconductor layer of a semiconductor-on-insulator (SOI) wafer (e.g., a silicon layer of a silicon-on-insulator (SOI) wafer) (not shown). In any case, the semiconductor substrate 101 can have a first type conductivity (e.g., a P-type conductivity). Thus, for example, the semiconductor substrate 101 can comprise a P− silicon substrate (i.e., a silicon substrate having a relatively low concentration of a P-type dopant).

A shallow trench isolation (STI) region 102 can be formed within and at the top surface of the semiconductor substrate 101 so as to define the active area of the transistor structure 100 (204, see FIG. 3). The STI region 102 can be formed using conventional shallow trench isolation (STI) formation techniques. For example, a trench can be lithographically patterned and etched into the semiconductor substrate 101 so as to define the active region. The trench can then be filled with one or more isolation materials (e.g., silicon oxide (SiO$_2$), silicon nitride (SiN), silicon oxynitride (SiON) or any other suitable isolation materials).

Additionally, a sub-collector region 120 can be formed within the active area of the semiconductor substrate 101, as defined by the STI region 102 (204, see FIG. 3). Thus, the STI region 102 defines the dimensions (e.g., the length (not shown) and the width 123) of the sub-collector region 120. This sub-collector region 120 can be formed (e.g., implanted with a dopant) so as to have a second type conductivity that is different from the first type conductivity of the substrate (e.g., an N-type conductivity). Various different techniques for forming BJT and HBT collector regions having different configurations are well known in the art and can be incorporated into the method embodiments disclosed herein. For example, the sub-collector region 120 can be formed as a single N-well region within the substrate 101. Alternatively, the sub-collector region 120 can be formed as multiple N-type collector components, such as the following components described and illustrated in U.S. Patent Publication No. 2008/0265282 of Gluschenkov et al., published on Oct. 30, 2008, assigned to International Business Machines Corporation, and incorporated herein by reference: an N+ buried collector within the substrate; a N− collector above the N+ buried collector and extending to the top surface of the substrate; and an N+ selective implant collector (SIC) within the N− collector immediately adjacent to the N+ buried collector and separated from the top surface of the substrate by some distance. It should be noted that this region 120 is referred to herein as a sub-collector region because it will be below a raised collector pedestal subsequently formed at process 210, discussed below.

Figure 4:
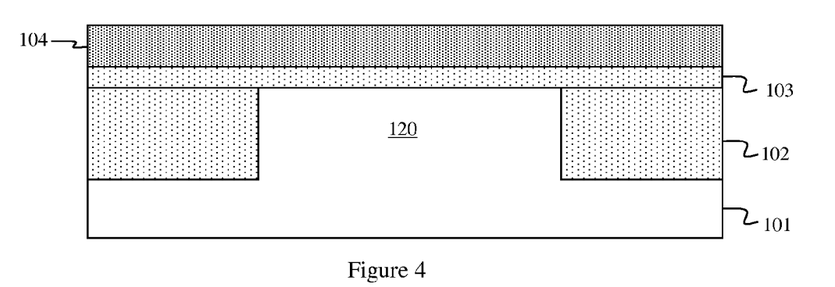
FIG. 4 is a cross-section diagram illustrating a partially completed BJT or HBT formed according to the method of FIG. 2.
Figure 5:
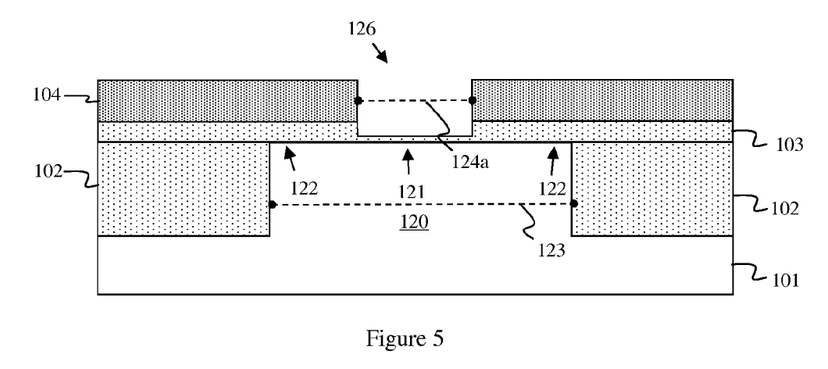
FIG. 5 is a cross-section diagram illustrating a partially completed BJT or HBT formed according to the method of FIG. 2.

The method embodiments can further comprise forming at least one dielectric layer 103, 104 on the top surface of the semiconductor substrate 101 above the STI region 102 and the sub-collector region 120 (206, see FIG. 4). Specifically, dielectric layer(s) can be deposited onto the substrate 101 such that they have a total thickness ranging from 10-400 nm and, preferably, ranging from 60-120 nm (e.g., 90 nm) as measured from the top surface of the semiconductor substrate 101 to the top surface of the dielectric layer(s). In one embodiment, a first dielectric layer 103 can be deposited such that it blankets the top surface of the semiconductor substrate 101 over the sub-collector region 120 and the STI region 102 and further such that it has a thickness of 10-30 nm (e.g., 20 nm). Then, a second dielectric layer 104 comprising a different dielectric material can be deposited on the first dielectric layer 103 such that it has a thickness of 50-90 nm (e.g., 70 nm). For example, the first dielectric layer 103 can be formed by depositing a silicon dioxide (SiO$_2$) layer onto the semiconductor substrate 101 and the second dielectric layer 104 can be formed by depositing a silicon nitride (SiN) layer on the SiO$_2$ layer. Alternatively, any one or more of the following dielectric materials can be deposited to form the dielectric layer(s): a silicon oxynitride (SiNO) layer, a high-K dielectric layer (e.g., hafnium oxide (HFO$_2$), zirconium oxide (ZrO2), etc.), or any other suitable dielectric layer. Next, a trench 126 (i.e., an opening) can be formed (e.g., using conventional lithographic patterning and anisotropic selective etch techniques) such that it extends vertically through the dielectric layer(s) 104, 103 to the semiconductor substrate 101 (208, see FIG. 5). Specifically, this trench 126 can be patterned and etched such that it is aligned above sub-collector region 120 and such that it is essentially centered within the STI region 102 above the center portion 121 of the sub-collector region 120. Furthermore, this trench 126 can be patterned and etched such that it is narrower than the sub-collector region 120, as defined by the STI region 102, and such that the edge portions 122 of the sub-collector region 120 remain covered by the dielectric layer(s) 103-104.

Figure 6:
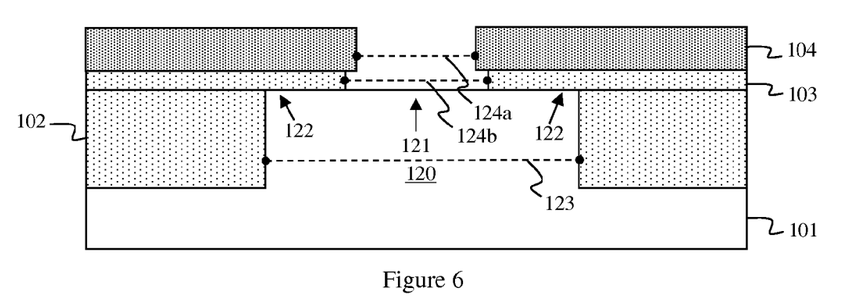
FIG. 6 is a cross-section diagram illustrating a partially completed BJT or HBT formed according to the method of FIG. 2.

It should be noted that, following trench 126 formation at process 208, a pre-cleaning process can be performed to remove all dielectric material and, particularly, all oxide material at the bottom surface of the trench 126 in preparation for a subsequent selective epitaxy process discussed in detail below (210). For example, the wafer can be cleaned using what is referred to in the art as an "RCA" cleaning process, wherein dilute hydrofluoric acid (HF) solution is used to remove native oxide prior wafer loading through a loadlock for epitaxial deposition. Additionally, a high temperature hydrogen prebake process can be performed (e.g., at approximately 800° C. or above for approximately 2 minutes) in order to further remove surface contaminants. Such a pre-cleaning process will typically pull back any silicon dioxide (SiO$_2$) sidewalls within the trench 126. Thus, in the resulting structure, the lower portion of the trench 126 within the first dielectric layer 103 (e.g., within the silicon dioxide (SiO$_2$) layer) may have a first width 124$a$ and the upper portion of the trench 126 within the second dielectric layer 104 (e.g., within the silicon nitride (SiN) layer) may have a second width 124$b$ that is slightly less (e.g., a few nanometers to a few tens of nanometers less, 5-50 nm less, etc.) than the first width 124$a$ (see FIG. 6). In any case, the trench 126 should be patterned at process 208 and subsequently pre-cleaned, if applicable, such that the maximum trench width 124$b$ is less than the width 123 of the sub-collector region 120, as defined by the STI region 102 (e.g., such that the maximum trench width 124$b$ ranges from ⅓ to ⁹⁄₁₀ the width 123 of the sub-collector region 120, such that the trench width 124$b$ is ½ the width 123 of the sub-collector region 120, etc.) The trench 126 should further be etched at process 208 such that the depth of the trench 126 is approximately equal to the total thickness of the dielectric layer(s) 103-104 (i.e., such that the surface of the semiconductor substrate 101 is exposed).

Figure 7:
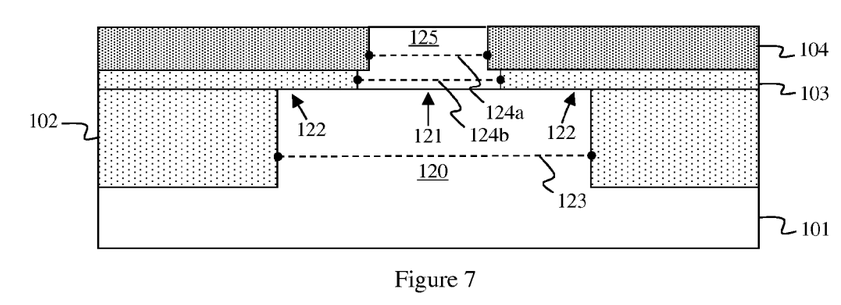
FIG. 7 is a cross-section diagram illustrating a partially completed BJT or HBT formed according to the method of FIG. 2; and, FIG. 8 is a cross-section diagram illustrating a partially completed BJT or HBT formed according to the method of FIG. 2.

After the trench 126 is formed and, if applicable, after the pre-cleaning process is performed, the trench 126 can be filled with a semiconductor layer 125 (210, see FIG. 7). For example, in the case of either a bipolar junction transistor (BJT) or a heterojunction bipolar transistor (HBT), an epitaxial semiconductor layer (e.g., an epitaxial silicon layer) can be selectively grown within the trench 126 on the surface of the semiconductor substrate 101. Those skilled in the art will recognize that under certain process conditions this semiconductor layer 125 can be selectively grown such that it is deposited on the exposed surface a semiconductor substrate 101 and not on the adjacent dielectric material (e.g., on a silicon dioxide (SiO$_2$) layer 103 or a silicon nitride (SiN) layer 104). Those skilled in the art will further recognize that as a result of such a selective epitaxy process the semiconductor layer 125 that fills the trench 126 will typically have the same crystalline structure as the semiconductor substrate 101 on which it is grown (e.g., a monocrystalline structure). Additionally, it should be noted this semiconductor layer 125 can be either in-situ doped or subsequently implanted with a second type conductivity dopant (e.g., an N-type dopant) such that it has the same type conductivity, but lower conductivity level, than the sub-collector region 120 below. Thus, this process 210 of forming the semiconductor layer 125 and filling the trench 126 results in the formation of either an un-doped or low-doped raised collector pedestal. For example, in one embodiment, an N-doped epitaxial semiconductor layer can be selectively grown in the trench 126 using dichlorosilane gas of tens of sccm reacted with an N-type dopant gas and an etching gas of hydrochloric acid (HCL), with a pressure was in the order of hundreds of Ton and a temperature in the range of 600° C. to 850° C.

Figure 8:
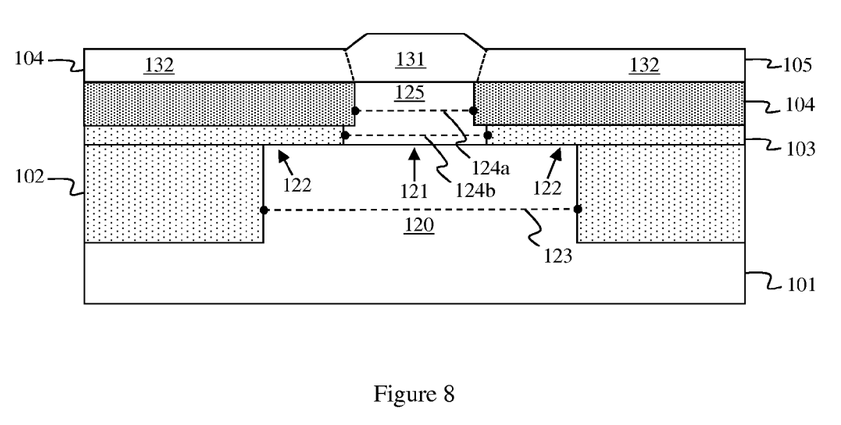

Next, an intrinsic base layer 105 (e.g., another semiconductor layer) can be formed above and immediately adjacent to the top surface of the dielectric layer(s) (e.g., the top surface of the silicon nitride (SiN) layer 104) and the top surface of the semiconductor layer 125 within the trench 126 (i.e., the top surface of the raised collector pedestal) (212, see FIG. 8). For example, in the case of a BJT, a silicon layer can be formed above and immediately adjacent to the top surface of the dielectric layer(s) and the top surface of the semiconductor layer 125 within the trench 126. Alternatively, in the case of an HBT, a silicon germanium layer can be formed above and immediately adjacent to the top surface of the dielectric layer(s) and the top surface of the semiconductor layer 125 within the trench 126. In any case, this intrinsic base layer 105 can be formed, for example, by performing a non-selective epitaxy process (e.g., a non-selective, ultra high-vacuum/chemical vapor deposition (UHV/CVD), low-temperature epitaxy (LTE) process). Those skilled in the art will recognize that, as a result of such a non-selective epitaxy process, the intrinsic base layer 105 will typically comprise a monocrystalline first section 131 and a polycrystalline second section 132. The monocrystalline first section 131 will be formed above and immediately adjacent to the top surface of the monocrystalline semiconductor layer 125 (i.e., the raised collector pedestal) and the polycrystalline second section 132 will be formed above and immediately adjacent to the top surface of the dielectric layer(s). Furthermore, the polycrystalline second section 132 will typically be less thick than the monocrystalline first section 131. Finally, the intrinsic base layer 105 can be un-doped or, alternatively, it can be in-situ doped or subsequently implanted with a relatively low concentration of a first type conductivity dopant (e.g., a P-type dopant) such that it has the first type conductivity (e.g., P-type conductivity).

After the intrinsic base layer 105 is formed at process 212, additional process steps can be performed in order to complete the transistor structure 100 (214, see FIG. 1). These additional process steps can comprise conventional BJT and HBT process steps for forming additional features including, but not limited to, the following features described in detail above: additional dielectric layer(s), a mask layer, dielectric spacer(s), a raised extrinsic base layer, silicide layer(s), an emitter layer, contacts, etc. Various different techniques for forming these features are well known in the art and, thus, are omitted from this specification in order to allow the reader to focus on the salient aspects of the method embodiments. However, it should be understood that any of these various techniques could be incorporated into the different method embodiments disclosed.

The method embodiments described above result in a transistor structure 100 wherein the space between the extrinsic base layer 108 and the sub-collector region 120 within the semiconductor substrate 101 is increased as compared to prior art transistor structures and this increased space is filled by dielectric material (e.g., dielectric layers 103-104). Furthermore, the electrical connection (i.e., the link-up or reach-through) between the intrinsic base layer 105 and the sub-collector region 120 is provided by the relatively narrow, un-doped or low-doped, raised collector pedestal. As a result, base-collector junction capacitance $C_{bc}$ is reduced within this transistor structure 100 and, consequently, the maximum oscillation frequency $F_{max}$ is increased.

It should be noted that in the structure and method embodiments described above, the first type conductivity is referred to as being P-type conductivity and the second type conductivity is referred to as being N-type conductivity. However, alternatively, the reverse can be true. That is, the first type conductivity can comprise N-type conductivity and the second type conductivity can comprise P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (MG), whereas a gallium nitride (GaN)-based semiconductor material having an N-type conductivity is typically doped with silicon (Si). Those skilled in the art will also recognize that different conductivity levels of the different transistor components will depend upon the relative concentration levels of the dopants. For example, a higher P-type conductivity level in the raised extrinsic base layer 108 as compared to the intrinsic base layer 105 can be achieved using a higher relative dopant concentration.

It should be understood that the terminology used herein is for the purpose of describing particular embodiments only and is not intended to be limiting of the embodiments. As used herein, the singular forms "a", "an" and "the" are intended to include the plural forms as well, unless the context clearly indicates otherwise. It should further be understood that the terms "comprises", "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. In addition, it should be understood that terms such as "right", "left", "vertical", "horizontal", "top", "bottom", "upper", "lower", "under", "below", "underlying", "over", "overlying", "parallel", "perpendicular", etc., used herein are relative locations as they are oriented and illustrated in the drawings (unless otherwise indicated). Furthermore, terms such as "touching", "on", "in direct contact", "abutting", "directly adjacent to", "immediately adjacent to", etc., are intended to mean that at least one element physically contacts another element (without other elements separating the described elements).

It should further be understood that the method embodiments, as described above, are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Finally, it should be understood that the corresponding structures, materials, acts, and equivalents of all means or step plus function elements in the claims below are intended to include any structure, material, or act for performing the function in combination with other claimed elements as specifically claimed. The above description of the embodiments is presented for purposes of illustration and is not intended to be exhaustive or limiting. Many modifications and variations to the disclosed embodiments will be apparent to those of ordinary skill in the art without departing from the scope and spirit of the disclosed embodiments.

Therefore, disclosed above are embodiments of a transistor structure (e.g., bipolar junction transistor (BJT) structure or a heterojunction bipolar transistor (HBT) structure) and a method of forming the transistor structure with an un-doped or low-doped raised collector pedestal with reduced dimensions for reduced base-collector junction capacitance $C_{bc}$. Specifically, in the embodiments, an un-doped or low-doped raised collector pedestal can be positioned on the top surface of a semiconductor substrate, can extend vertically through at least one dielectric layer, can be aligned above a sub-collector region contained within the substrate and can be narrower than that sub-collector region. An intrinsic base layer can be positioned above the raised collector pedestal and the dielectric layer(s). An extrinsic base layer can be positioned above the intrinsic base layer. An essentially T-shaped emitter layer can have a lower portion that extends vertically through the extrinsic base layer to the intrinsic base layer, that is electrically isolated from the extrinsic base layer and that is aligned above the raised collector pedestal. Thus, the space between the extrinsic base layer and the sub-collector region within the semiconductor substrate is increased as compared to prior art transistor structures. This increased space is filled by dielectric material and the electrical connection (i.e., the link-up or reach-through) between the intrinsic base layer and the sub-collector region is provided by the relatively narrow, un-doped or low-doped, raised collector pedestal. As a result, base-collector junction capacitance $C_{bc}$ is reduced and, consequently, the maximum oscillation frequency $F_{max}$ is increased.

What is claimed is:

1. A transistor comprising:
   a semiconductor substrate;
   a trench isolation regions in said substrate;
   a sub-collector region in said substrate positioned laterally adjacent to said trench isolation region such that top surfaces of said trench isolation region and said sub-collector region are essentially co-planar;
   a first dielectric layer on said substrate immediately adjacent to said top surfaces of said sub-collector region and said trench isolation region;
   a second dielectric layer on said first dielectric layer, said second dielectric layer comprising a different dielectric material than said first dielectric layer;
   a trench extending vertically through said second dielectric layer and said first dielectric layer to said substrate, said trench having a lower portion with a first width within said first dielectric layer and an upper portion with a second width that is less than said first width within said second dielectric layer;
   a raised collector pedestal on said substrate, said raised collector pedestal comprising a semiconductor layer filling said lower portion and said upper portion of said trench; and
   an intrinsic base layer on said second dielectric layer and said semiconductor layer.

2. The transistor of claim 1, said trench being aligned above said sub-collector region.

3. The transistor of claim 2, said lower portion of said trench being narrower in width than said sub-collector region.

4. The transistor of claim 1, said first dielectric layer comprising an oxide layer and said second dielectric layer comprising a nitride layer.

5. The transistor of claim 1, said first dielectric layer having a first thickness and said second dielectric layer having a second thickness, said first thickness being less than said second thickness such that a wider portion of said semiconductor layer within said lower portion of said trench is relatively thin as compared to a narrower portion of said semiconductor layer of within said upper portion of said trench.

6. The transistor of claim 1, said semiconductor layer comprising a selectively grown epitaxial semiconductor layer and said intrinsic base layer comprising a non-selectively grown epitaxial semiconductor layer.

7. A heterojunction bipolar transistor comprising:
   a silicon substrate;
   a trench isolation region in said substrate;
   a sub-collector region in said substrate positioned laterally adjacent to said trench isolation region such that top surfaces of said trench isolation region and said sub-collector region are essentially co-planar;
   a first dielectric layer on said substrate immediately adjacent to said top surfaces of said sub-collector region and said trench isolation region;
   a second dielectric layer on said first dielectric layer, said second dielectric layer comprising a different dielectric material than said first dielectric layer;
   a trench extending vertically through said second dielectric layer and said first dielectric layer to said substrate, said trench having a lower portion with a first width within said first dielectric layer and an upper portion with a second width that is less than said first width within said second dielectric layer;
   a raised collector pedestal on said substrate, said raised collector pedestal comprising a silicon layer filling said lower portion and said upper portion of said trench; and
   an intrinsic base layer on said second dielectric layer and said silicon layer.

8. The transistor of claim 7, said trench being aligned above said sub-collector region.

9. The transistor of claim 8, said lower portion of said trench being narrower in width than said sub-collector region.

10. The transistor of claim 7, said first dielectric layer comprising an oxide layer and said second dielectric layer comprising a nitride layer.

11. The transistor of claim 7, said first dielectric layer having a first thickness and said second dielectric layer having a second thickness, said first thickness being less than said second thickness such that a wider portion of said silicon layer within said lower portion of said trench is relatively thin as compared to a narrower portion of said silicon layer within said upper portion of said trench.

12. The transistor of claim 7, said silicon layer comprising a selectively grown epitaxial silicon layer and said intrinsic base layer comprising a non-selectively grown epitaxial silicon germanium layer.

13. A transistor comprising:
   a semiconductor substrate;
   a trench isolation region in said substrate;
   a sub-collector region in said substrate positioned laterally adjacent to said trench isolation region such that top surfaces of said trench isolation region and said sub-collector region are essentially co-planar;

a first dielectric layer on said substrate immediately adjacent to said top surfaces of said sub-collector region and said trench isolation region, said first dielectric layer having a first thickness;

a second dielectric layer on said first dielectric layer, said second dielectric layer having a second thickness and comprising a different dielectric material than said first dielectric layer;

a trench extending vertically through said second dielectric layer and said first dielectric layer to said sub-collector region in said substrate, said trench having a lower portion with a first width within said first dielectric layer and an upper portion with a second width that is less than said first width within said second dielectric layer;

a raised collector pedestal on said sub-collector region,
said raised collector pedestal comprising a semiconductor layer filling said lower portion and said upper portion of said trench, and
said first thickness of said first dielectric layer being less than said second thickness of said second dielectric layer such that a wider portion of said semiconductor layer within said lower portion of said trench is relatively thin as compared to a narrower portion of said semiconductor layer within said upper portion of said trench; and an intrinsic base layer comprising a monocrystalline section on said semiconductor layer and a polycrystalline section extending laterally from said monocrystalline section over said second dielectric layer.

14. The transistor of claim 13, said lower portion of said trench being narrower in width than said sub-collector region.

15. The transistor of claim 13, said first dielectric layer comprising an oxide layer and said second dielectric layer comprising a nitride layer.

16. The transistor of claim 13, said first thickness being approximately 10-30 nm and said second thickness being approximately 50-90 nm.

17. The transistor of claim 13, said semiconductor layer comprising a selectively grown epitaxial semiconductor layer and said intrinsic base layer comprising a non-selectively grown epitaxial semiconductor layer.

18. A heterojunction bipolar transistor comprising:
a silicon substrate;
a trench isolation region in said substrate;
a sub-collector region in said substrate positioned laterally adjacent to said trench isolation region such that top surfaces of said sub-collector region and said trench isolation region are essentially co-planar;

a first dielectric layer on said substrate immediately adjacent to said top surfaces of said sub-collector region and said trench isolation region, said first dielectric layer having a first thickness;

a second dielectric layer on said first dielectric layer, said second dielectric layer having a second thickness and comprising a different dielectric material than said first dielectric layer;

a trench extending vertically through said second dielectric layer and said first dielectric layer to said sub-collector region, said trench having a lower portion with a first width within said first dielectric layer and an upper portion with a second width that is less than said first width within said second dielectric layer;

a raised collector pedestal on said sub-collector region,
said raised collector pedestal comprising a silicon layer filling said lower portion and said upper portion of said trench, and
said first thickness of said first dielectric layer being less than said second thickness of said second dielectric layer such that a wider portion of said silicon layer within said lower portion of said trench is relatively thin as compared to a narrower portion of said silicon layer within said upper portion of said trench; and an intrinsic base layer comprising a monocrystalline section on said silicon layer and a polycrystalline section extending laterally from said monocrystalline section over said second dielectric layer.

19. The transistor of claim 18, said lower portion of said trench being narrower in width than said sub-collector region.

20. The transistor of claim 18, said first dielectric layer comprising an oxide layer and said second dielectric layer comprising a nitride layer.

21. The transistor of claim 18, said first thickness being approximately 10-30 nm and said second thickness being approximately 50-90 nm.

22. The transistor of claim 18, said silicon layer comprising a selectively grown epitaxial silicon layer and said intrinsic base layer comprising a non-selectively grown epitaxial silicon germanium layer.

* * * * *